United States Patent [19]
Garziera

[11] 3,978,453
[45] Aug. 31, 1976

[54] INPUT KEYBOARD APPARATUS FOR AN ELECTRONIC COMPUTER

[75] Inventor: Gastone Garziera, Ivrea (Turin), Italy

[73] Assignee: Ing. C. Olivetti & C., S.p.A., Ivrea (Turin), Italy

[22] Filed: Apr. 8, 1974

[21] Appl. No.: 459,159

[30] Foreign Application Priority Data
Apr. 24, 1973 Italy .................................. 68155/73

[52] U.S. Cl. ............................................ 340/172.5
[51] Int. Cl.² .......................................... G06F 3/02
[58] Field of Search ........... 340/172.5, 365 S, 365 R

[56] References Cited
UNITED STATES PATENTS

| | | |
|---|---|---|
| 3,593,313 | 7/1971 | Tomaszewski et al. ........... 340/172.5 |
| 3,745,536 | 7/1973 | Klehm, Jr. ........................ 340/172.5 |
| 3,760,171 | 9/1973 | Wang et al. ..................... 340/172.5 X |
| 3,863,060 | 1/1975 | Rode et al. ............................ 235/156 |

Primary Examiner—David H. Malzahn
Attorney, Agent, or Firm—I. J. Schaefer

[57] ABSTRACT

A keyboard and circuitry for recording the key on the keyboard that is depressed. The recorded information is then supplied to a computer which acts in accordance with the information associated with the depressed key. The keyboard is arranged in a matrix of rows and columns. The recording circuitry comprises a shift register having two groups of cells, the first group receptive of an information bit from the column of the depressed key and the record group receptive of an information bit from the row of the depressed key. The shift register are then shifted and the information stored therein is utilized by the computer. The encoding and the storage of the information entered on the keyboard are effected by the central unit carrying out the commands in a control store under the control of a microprogram.

15 Claims, 12 Drawing Figures

INPUT KEYBOARD APPARATUS FOR AN ELECTRONIC COMPUTER

BACKGROUND OF THE INVENTION

The present invention relates to an electronic computer comprising an information input keyboard and a memory for storing an indication of an actuated key.

DESCRIPTION OF THE PRIOR ART

In known machines, the transfer of information from a peripheral keyboard to the central unit generally takes place after encoding of the information entered on the keyboard. The central unit then sends the relevant control signals to the keyboard controller, commanding the desired transfer. This method of operating entails a relative slowness which is also due to the limited speed of the peripheral decoding circuits. Moreover, these decoding circuits generally require for their driving special electrical characteristics of the pulses generated by the keys of the keyboard, and this is reflected in the complexity both of the circuitry and of the design of these circuits.

Other keyboards, moreover, for example those employing matrices of diodes, in addition to having a limited working speed, use a large number of components.

SUMMARY OF THE INVENTION

These disadvantages are obviated by the present invention, which provides an electronic computer comprising an information input keyboard and a memory for storing an indication of an actuated key, characterised in that the keys of the keyboard are assigned to a progressive order, means being provided for producing the storage in the memory of a number corresponding to the progressive order of the actuated key.

These characteristics and other characteristics of the invention will become clear from the following description of a preferred embodiment, given by way of example, with reference to the accompanying drawings, in which:

DESCRIPTION OF THE PREFERRED EMBODIMENT

GENERAL DESCRIPTION

Figure 1:
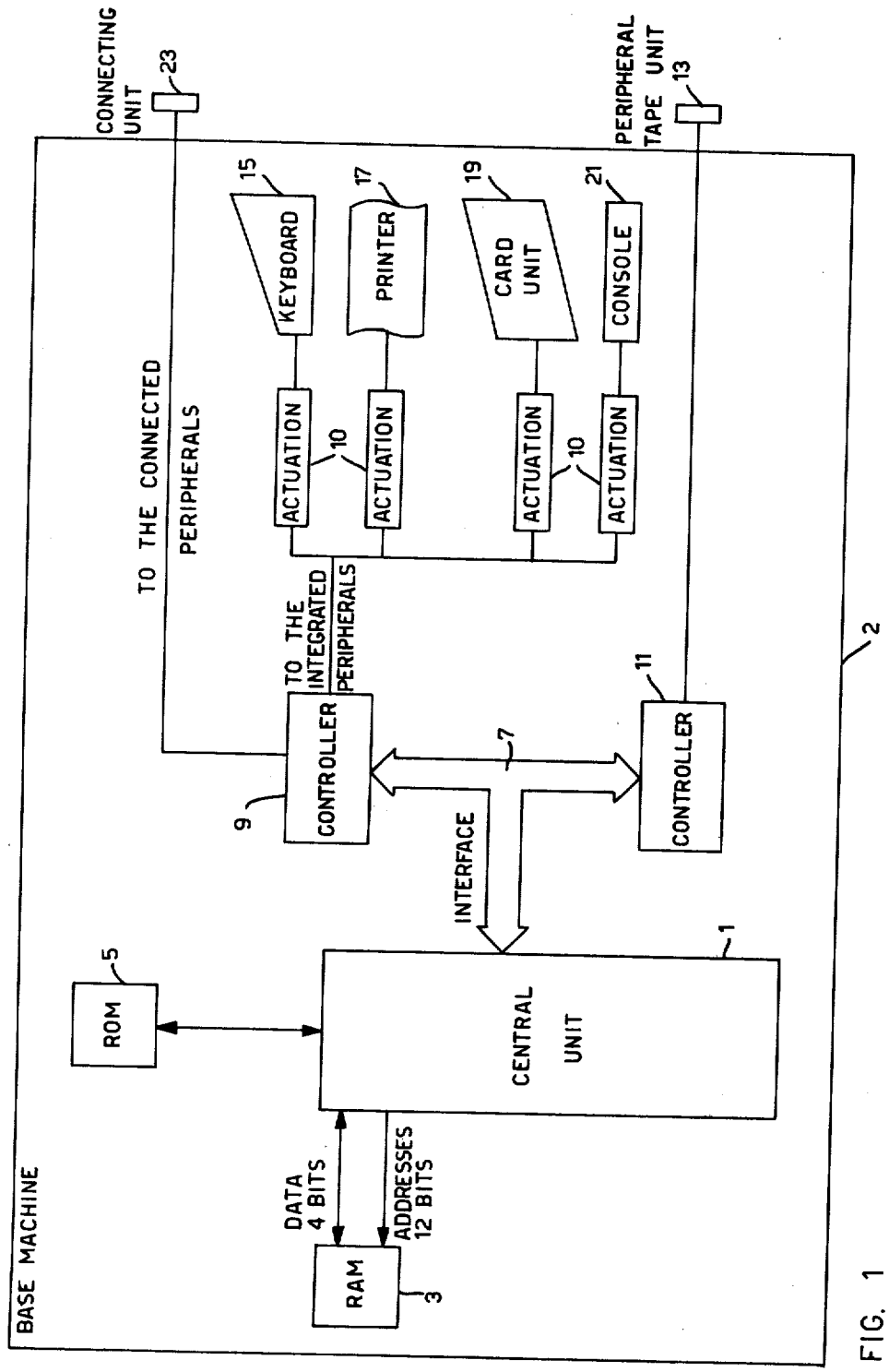
FIG. 1 is a block diagram of the computer embodying the invention.

FIG. 1 shows a computer constituted essentially by a base machine 2. The machine 2 comprises a central unit 1 adapted to control, in the manner which will be described hereinafter, the processing of the data and the flow thereof between the other units of which the computer is composed. The machine 2 moreover comprises a random access read/write memory 3, labelled the RAM, adapted to store data and instructions to be utilized in successive processing operations. The machine 2 furthermore comprises a read-only control memory 5, hereinafter called the ROM, adapted to store the microprograms controlling the elementary machine operations.

The central unit 1 is moveover connected through a channel 7 to two control units 9 and 11. The controller 11 controls in known manner the exchange of information between the central unit 1 and a peripheral magnetic tape unit 13 and is of known type. The controller 9 is adapted to control the exchange of information between the central unit 1 and a group of peripherals 15, 17, 19 and 21 each controlled by a corresponding group of actuating circuits 10.

More particularly, the peripheral 15 is an alphanumeric keyboard, the key arrangement of which is of the type described in U.S. Pat. No. 3,692,167 in the name of Teresio Gassino. The peripheral 17 is an alphanumeric serial printer, for example of the type described in U.S. Pat. No. 3,651,916 in the name of Raffaele Becchi. The peripheral 19 is a read/write unit for magnetic index cards, of the type described in U.S. Pat. No. 3,495,222 in the name of Pier Giorgio Perotto and Giovanni De Sandre.

The peripheral 21 is a command console of a type known per se and therefore not described in detail. It comprises substantially function pushbuttoms and indicators which define the operative state or order of the machine. One pushbutton, called, for example, the "Record Program" pushbutton, defines that an instruction tapped out on the keyboard must not be executed but is to be loaded into the RAM 3. Another pushbutton, called the "Single Step" pushbutton, defines the execution step by step of the program, which then stops after each instruction carried out. This is then printed by the printer 17.

Other peripherals such as a plotter, measuring instruments, an auxiliary printer and a diagnostic apparatus may be connected to the central unit through a connecting unit 23.

The RAM 3 is a read and write memory, comprising semiconductors, i.e., produced by MOS technology and having a preferred maximum capacity of 4096 locations, each location being composed of four bits sufficient to represent a numeric character from 0 to 9. The RAM 3 (FIG. 2) is constituted by 16 MOS chips $14_0, 14_1, \ldots 14_{15}$ grouped in four groups. These are disposed physically in four superposed planes. More particularly, each group includes one chip from each plane and to the first group there belong the chips $14_0, 14_4, 14_8, 14_{12}$, to the second group there belong the chips $14_1, 14_5, 14_9, 14_{13}$, and so on for the other groups. Each chip contains 1024 bits disposed in a square grid of 32 positions per side. A four bit character is stored at four like positions of the four chips in a group.

Figure 2:
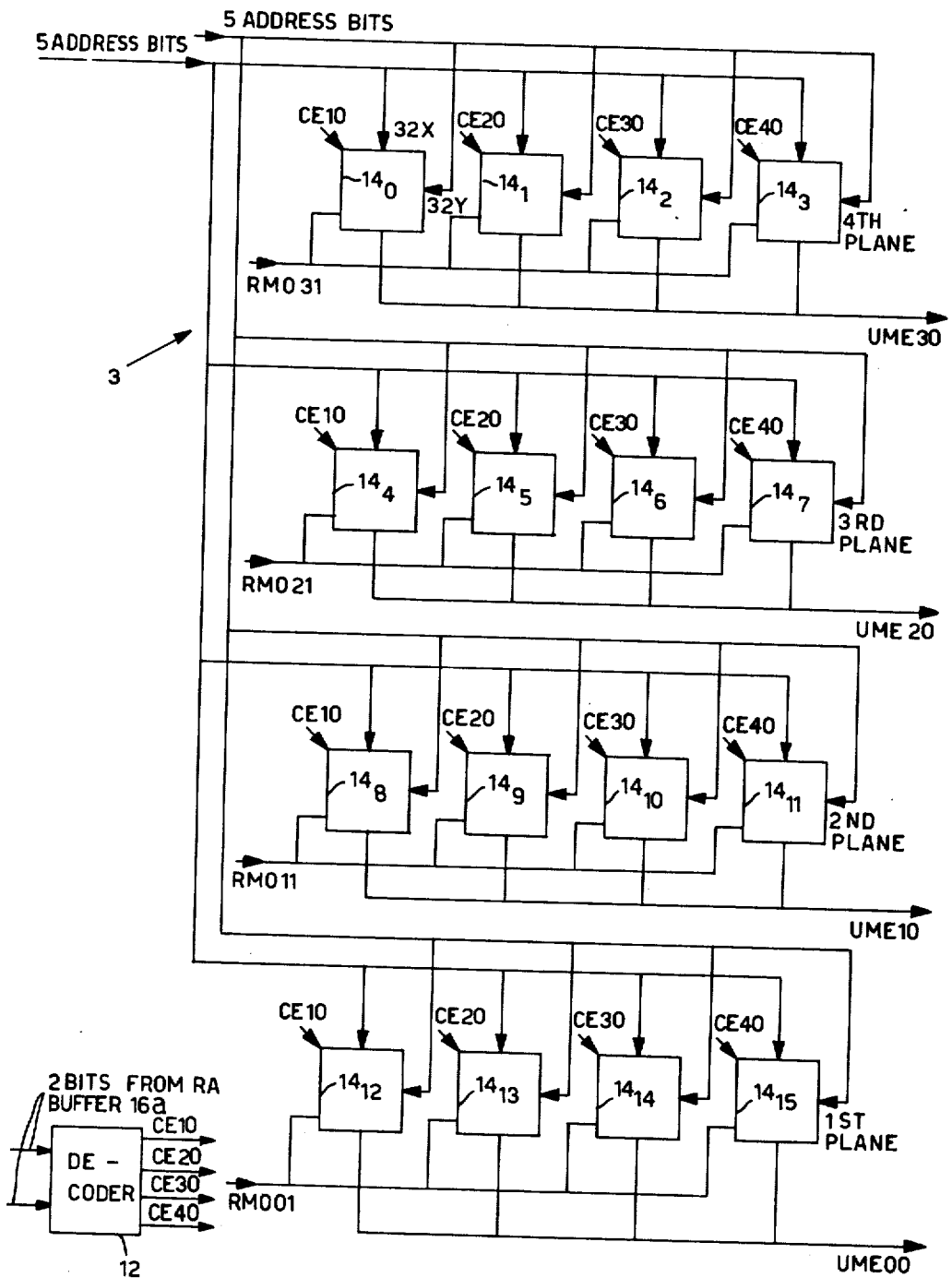
FIG. 2 is a block diagram of a random access read/write memory (RAM) of the computer.

To address a memory location of the RAM 3, twelve bits are therefore necessary: 5 + 5, indicated in FIG. 2 as "address bits," identify a point of the 32 × 32 grid of all the chips, and another 2 bits arrive at a decoding circuit 12 known per se and are decoded, generating four pulses called CE 10, CE 20, CE 30, CE 40. These four pulses are applied to the chips of the corresponding group and identify, in the four planes simultaneously, the group of chips 14 concerned. The RAM 3 provides a parallel output of 4 bits called UME 00, UME 10, UME 20, and UME 30 and writes in parallel input of 4 bits called RM001, RM011, RM021 and RM031. The outputs are rendered active in the absence of a writing enabling signal, while the inputs RMO are rendered active by the presence of the writing enabling signal. This signal is emitted by a suitable circuit known per se included in the central unit 1 (FIG. 3) in a sequence network 24 thereof, as a function of the reading or writing instruction which it is desired to carry out.

The individual characters of the RAM 3, which are formed by four bits, are grouped in turn in groups of fifteen to form 60-bit, 15 character registers. In the whole of the RAM 3 there can thus be identified 240 registers usable for containing numeric data or instructions of the user. The division of the individual registers serves for floating point representation of the numeric data.

More particularly, a generic numeric datum is represented by a mantissa or fixed point part of 12 characters, an exponent of two characters and 4 bits, the first of which represents the algebraic sign of the exponent and the last that of the fixed point part.

Table 1 shows an example of floating point representation of the numbers 0.0004951627 and − 29,841,630.2051.

TABLE 1

| NUMBER | REPRESENTATION IN MEMORY | | |
|---|---|---|---|
| | FIXED POINT PART | EXP. | SIGNS |
| 0.0004951627 | 495162700000 | 03 | 1000 |
| −29,841,630.2051 | 298416302051 | 08 | 0001 |

1 = −   sign EXP.
0 = +   sign FIXED POINT PART

Instead of a numeric datum, each register of the RAM 3 may contain five program instructions, each of which has a length of 12 bits. The instructions are composed basically of two fields: one which represents the operation to be effected is called the "Function code," while the other which identifies the register on the contents of which it is desired to operate is called the "Operand." Sometimes, in jump instructions inserted in a program to break the normal sequence of execution, the operand indicates the memory location starting from which the next instruction to be carried out will be found. As will be seen hereinafter, these instructions are compiled by the operator on the keyboard 15 (FIG. 1) by means of a combination of numeric and function keys.

The ROM 5 (FIG. 1) is a read-only control memory constituted by 12 MOS chips. Permanently recorded therein are the microinstructions which permit the execution of the keyboard instructions and produce the exchange of data between the various parts of the base machine 2 in accordance with the technique of microprogramming. Since each chip of the ROM contains 4096 bits and each microinstruction has a length of 16 bits, the maximum number of microinstructions which the ROM 5 can contain is 3072. The ROM is divided into six "pages", each comprising 512 microinstructions. The microinstructions are addressable by means of 12 bits: 3 to select the "page" and 9 to select the microinstruction from among the 512 possible in the "page".

The set of microinstructions is founded upon 35 different possible machine microoperations: these can be formed into six groups:

1. Exchange of data between the central unit 1 and the RAM 3 and between the ROM 5 and the RAM 3
2. Arithmetical operations
3. Logical operations
4. Transfer operations
5. Interface operations
6. Jumps.

CENTRAL UNIT

The central unit 1(FIG. 3) comprises a service or temporary memory 16, which will hereinafter also be called the S.P. (Scratch pad). This contains information frequently required or intermediate processing results, so as to avoid continuous access to the RAM 3, which has a memory cycle twenty times greater than the cycle of the memory 16. The latter is preferably constructed with bipolar integrated circuits: this enables speeds greater than those obtainable with MOS integrated circuits to be obtained.

Figure 4:
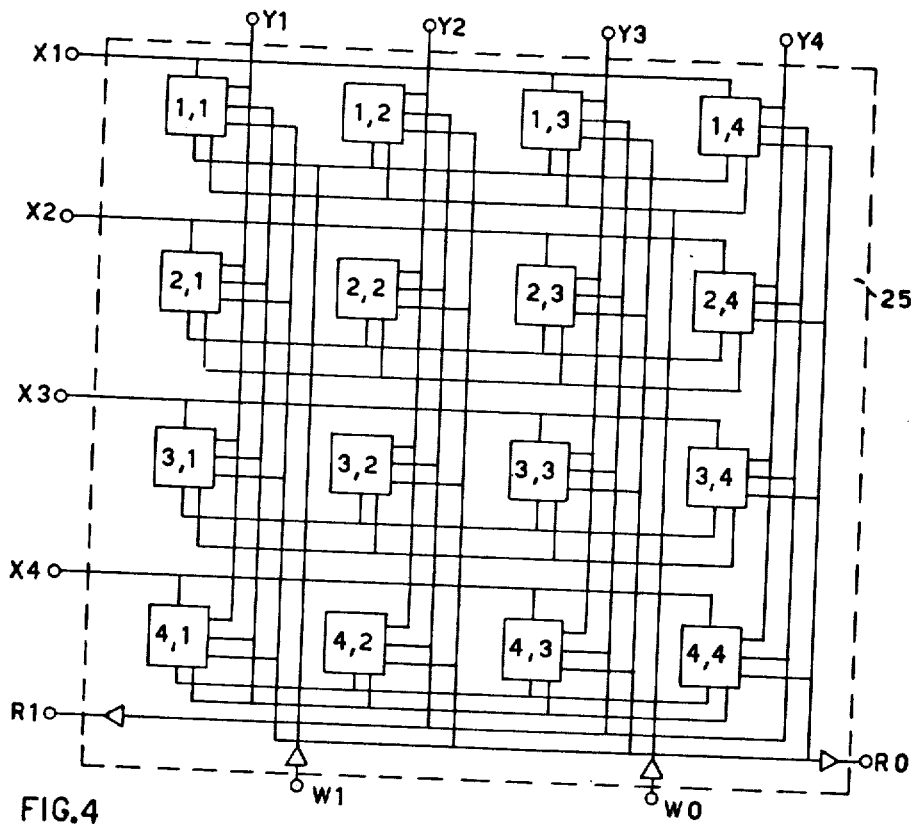
FIG. 4 is a diagram of a memory package of a scratch pad memory.

The S.P. 16 is composed of sixteen registers RO . . . R9, RA . . . RF. These registers each carry 12 bits available in parallel and disposed in 12 packages, each indicated by the reference 25 and constructed as shown in FIG. 4. Each package 25 contains 16 bits, which are the corresponding bits of the registers RO . . . R9, RA . . . RF. For example, the first package contains all the first bits of the 16 registers: the second package contains all the second bits of the 16 registers and so on as far as the 12th package which contains all the 12th bits of the 16 registers. Four bits are sufficient for addressing the registers of the S.P. 16.

There is moreover the possibility of arranging the 12 packages in three groups of four: to the first group, also called S.P. Col. 1 (FIG. 3), there belong the four packages containing the first four bits of the 16 registers, to the second group, or Col. 2, and Col. 3 there belong the four packages containing the second four bits of the sixteen registers, and so on. Thus, three S.P. columns are identified. In each single column there are always 16 different addressing possibilities and, therefore, sixteen registers this time with a parallelism of 4 bits. In the three columns, then, there are 48 registers in all with a parallelism of four, for the addressing of which 6 bits are required.

The usefulness of having both 4-bit registers and 12-bit registers in the S.P. memory 16 is the possibility of accommodating both 4-bit data coming from the RAM 3, to be retransmitted to the RAM 3 after being processed, and 12-bit addresses of the RAM 3 or the ROM 5.

Of the sixteen 12-bit registers of the S.P. 16, mention is merited by the first four, R0, R1, R2, R3, of which R0 always contains the current address of ROM 5, which is automatically increased by 1 at each microinstruction which is read, R1 contains constants sent by the ROM 5, R2 contains 12 switching elements, each of 1 bit, R3 contains the address of ROM 5 during the execution of a conditional jump micro-instructions.

The contents of these registers are automatically transferred to the registers R8 . . . RB, respectively, during the stages of initialization of the system which are started by pressing a RESET pushbuttom known per se included in the keyboard 15 (FIG. 1).

There is moreover a fourth column in the S.P. (FIG. 3), which is constituted by a single register SO2 consisting of four bistable flip-flops C, D, E, F. The register SO2 can be addressed by using only two bits necessary to identify the column of flip-flops C, D, E, F, since the register SO2 is the only one in the column. The flip-flops C, D, E, F are used as switching elements and are set according to quantitative results of a number of microinstructions, such as, for example, a number different from zero, a binary carry higher than 15, a binary carry higher than 4095, a binary number greater than 9.

The outputs of the S.P. 16 are connected to a reading or buffer register 16a composed of twelve bipolar flip-flops and which, in addition to storing the data output by the S.P. 16 and which is to be processed, serves as a channel for the data output by the central unit 1 to the peripheral units and to the RAM 3. Moreover, the buffer 16a may contain the address of the RAM 3 or alternatively the current address of the ROM 5.

Figure 7:
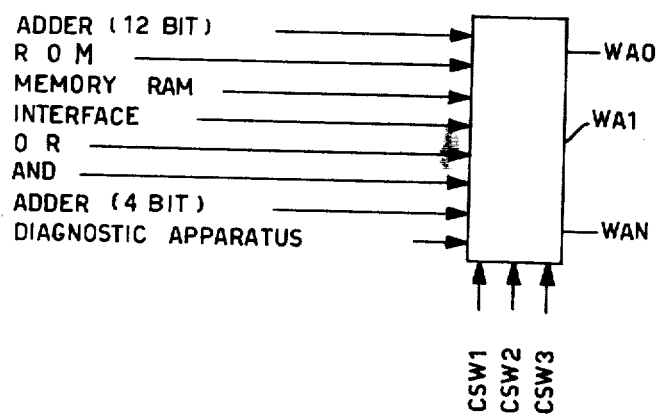
FIG. 7 is an example of a multiplexer circuit used for recording in memory.

The central unit 1 moreover comprises a writing network 16b at which there arrives the data which, after being processed by the arithmetic and logic unit, must return to the S.P. 16, or the data which enter the S.P. 16 from the peripherals, or from the RAM 3, or from the ROM 5. The network 16b is constituted by twelve like multiplexers, one per bit, of which only one WA1 is shown in FIG. 7. Each multiplexer has eight inputs selectable by three commands CSW1 to CSW3 of the central unit 1, and two outputs WAO, WAN, one direct and one negated.

Figure 8:
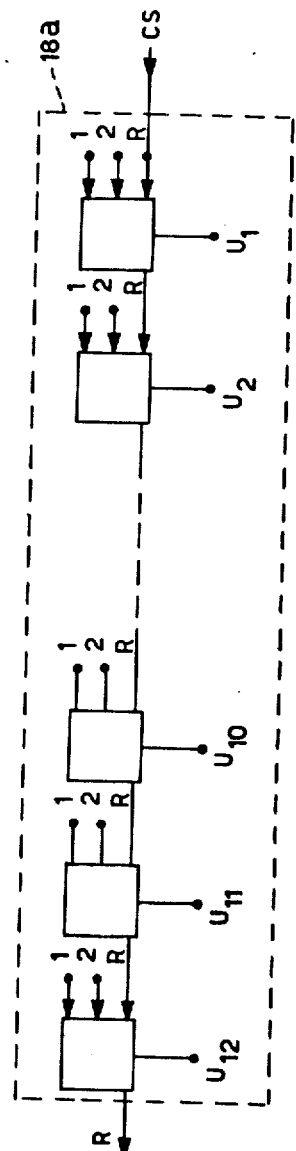
FIG. 8 shows an adding circuit of the central unit.

The central unit 1 (FIG. 3) moreover comprises an arithmetic and logic unit 18 constituted by an adder 18a (FIG. 8) having 12 cascaded stages U1 to U12 and of a type known per se, each of which is capable of executing an addition of three bits at a time. Two inputs 1, 2 of each stage are supplied with the bits to be added, the third R serves for the possible carry bit and forms the connection between the various stages of the adder. That is to say, the carry output of a certain stage constitutes the carry input of the following stage. The first stage receives at its input R a command CS from the central unit 1 which is equivalent to the presence of a 1 bit at the input R.

Figure 3:
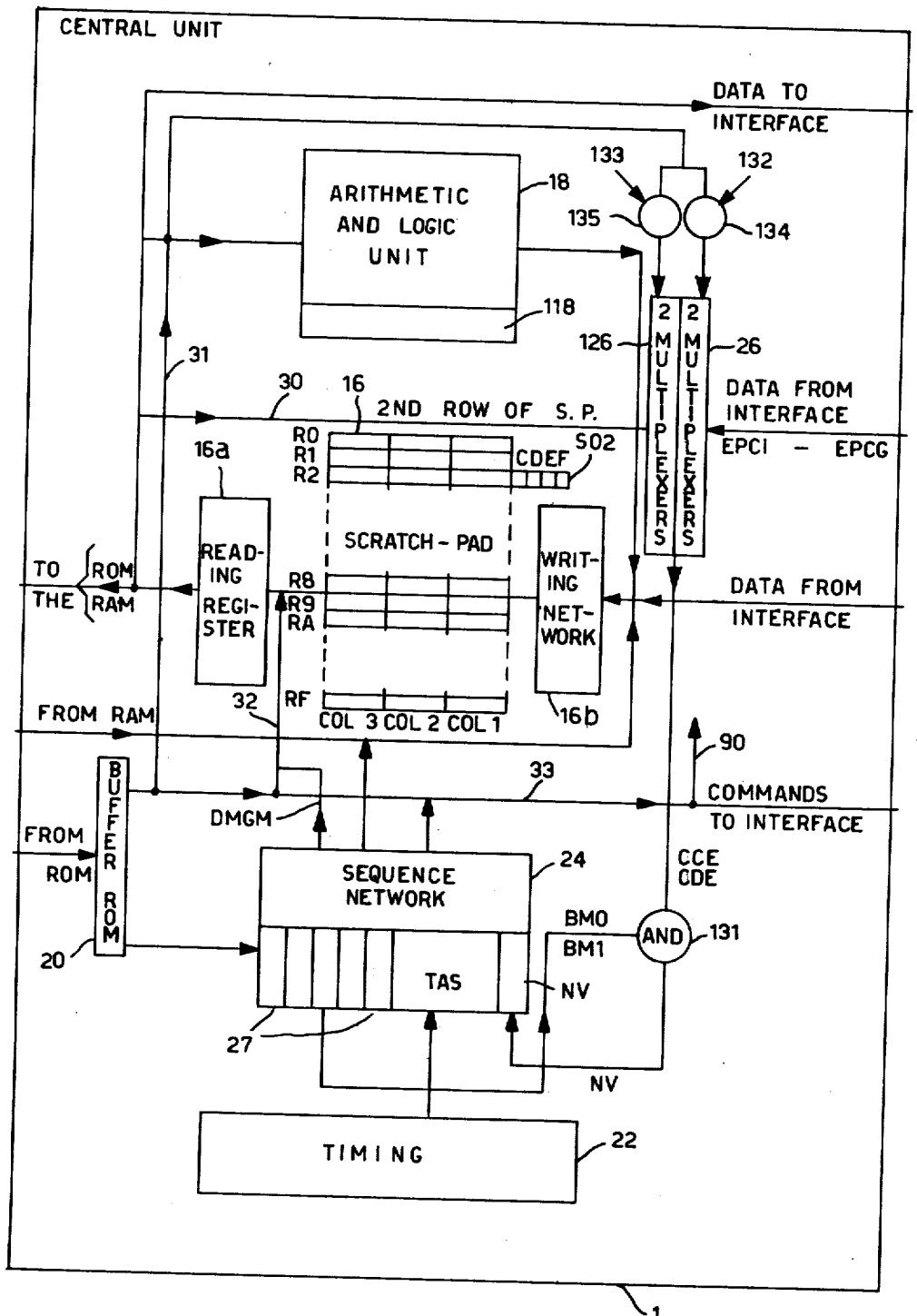
FIG. 3 is a block diagram of the central unit.

The adder 18a may be used as a 4-bit parallel adder, utilizing the outputs U1, U2, U3, U4 of the first four stages, or as a 12-bit parallel adder, utilizing all the outputs U1, U2, U3 . . . U12, respectively, for the additions on data and for the additions on addresses. The 12-bit outputs of the adder 18a constitute one of the inputs of the multiplexers WA1 to WA12 (FIG. 7) of the writing network 16b of the S.P. 16 (FIG. 3). The 4-bit outputs of the adder 18a constitute another of the inputs of the multiplexers WA1 to WA4 (FIG. 7) of the network 16b.

The unit 18 moreover comprises a logic network 118 (FIG. 3) known per se which performs the logical AND, NAND, OR and exclusive-OR functions between two 4-bit characters. The outputs of this logic network 118 constitute the two inputs AND and OR of WA1 (FIG. 7) and therefore of the S.P. 16 (FIG. 3).

The central unit moreover comprises a 16-bit register 20 hereinafter called the ROM buffer 20. This is a register contained in the central unit 1 which has output buffer functions for the microinstructions contained in the ROM 5. Each microinstruction follows a cycle in which, before being executed, it must be extracted from the ROM 5 at the address indicated by the first register RO of the S.P. 16, this address being incremented by 1 immediately afterwards, upon a command from the central unit 1. The register 20 receives the microinstruction in the 16-bit format, which is common to all the 35 possible microinstructions.

Figure 12:
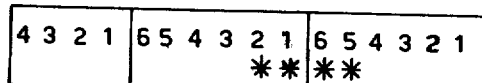
FIG. 12 shows the format of a microinstruction.

In the common format, the 16 bits of the microinstruction are assembled in three fields F, X, Y (FIG. 12). The first field F, consisting of four bits, serves to identify the function code, the second field X consisting of 6 bits generally serves to address a first operand in the S.P. 16, and the third field Y consisting of another 6 bits generally serves to address a second operand (4-bit registers) in the S.P. 16. Since the field F alone enables 16 possible microinstructions to be represented with its four bits, the remaining 19 microinstructions of the 35 different ones possible are represented by making use of 2 bits of the field X or Y which are marked with an asterisk in FIG. 12. In these cases, the remaining bits of the field X or Y are always sufficient for addressing the first and second operands, respectively, contained in two 12-bit registers of the S.P. 16.

In some jump microinstructions, the operand constituting the address is the only one and is formed by the fields X and Y together, which identify the configuration of all the 12 bits of the address.

The central unit 1 (FIG. 3) comprises a sequence network 24 adapted to generate combinatory-logic signals, called central unit commands, which ensure correct carrying out of a microinstruction. This network 24, of a type known per se, receives as input the decoded results obtained from the information coming from the ROM buffer 20 and arranges them from the time point of view, making use of the machine timing established by unit 22. These commands serve, for example, to enable the passage of information, to take logical decisions, to select data, to update addresses.

A set of five decoders 27 of a type known per se effects the main decoding operations appertaining to the microinstructions. The inputs of five decoders 27 receive the bits of the field F and of the field X, Y (FIG. 12) of the buffer 20.

Finally, the central unit 1 (FIG. 3) comprises a first pair of multiplexers 26, each having eight inputs, which are connected to the interface 7 (FIG. 1) and are adapted to receive signals indicating the state of the peripherals, and a second pair of multiplexers 126 (FIG. 3) having eight inputs, which are connected to the reading register 16a and adapted to receive the information recorded in a particular register of the S.P. 16. The multiplexers 26 and 126 are of known type and each of them has an output connected to an AND circuit 131 which also receives a signal emitted by the decoder 27 and indicating the particular microinstruction which is being executed. Moreover, each of the multiplexers 26 and 126 has four selection inputs connected to two AND circuits 134 and 135, respectively, for receiving as many selection signals. Of these one selects one of the two multiplexers of each pair and the others select the input which it is desired to poll.

The exchange of information between the central unit 1 (FIG. 1) and the controller 9 of the peripherals is ensured by a series of interface signals generated by the controller 9 of the peripherals or by the central unit 1. Among the signals generated by the controller 9 of the peripherals there appear 16 external conditions EPC1 ... EPC9, EPCA ... EPCG which reveal particular machine conditions (that is, for example, one of the pushbuttons of the console 21 depressed, or one of the keys of the keyboard 15 actuated) and are sent to the inputs of the two multiplexers 26.

Referring to FIG. 3, the output of the ROM buffer 20 (FIG. 3) which is concerned with the signals of the fields X and Y of the microinstructions varies according to the various microinstructions which are extracted from time to time from the ROM 5 and buffered in the ROM buffer 20. More particularly, while the four bits of the field F of the microinstructions interact with the sequence network 24 (decoder 27 and register TAS), the 6 bits of the field X and the 6 bits of the field Y of the microinstructions have the following possible outputs determined by enabling signals of the sequence network 24 which are not shown in FIG. 3:

a. along a connection 31, to the arithmetic and logic unit 18, for the addition microinstructions and for those logical microinstructions which execute logical additions or functions;

b. along a connection 32 to the output register 16a of the S.P. 16, which is previously zeroized, for the microinstructions which interact with the memory RAM 3;

c. along the connection 33 to the interface, for the microinstructions which command the sending of signals to the peripherals;

d. along the connection 90 to a selection network 120 (FIG. 5) known per se, for the coordinates X1 ... X4, Y1 ... Y4 of the S.P. 16, for the microinstructions which process the contents of a register of the S.P. 16.

MACHINE TIMING AND STATES

Figure 10:
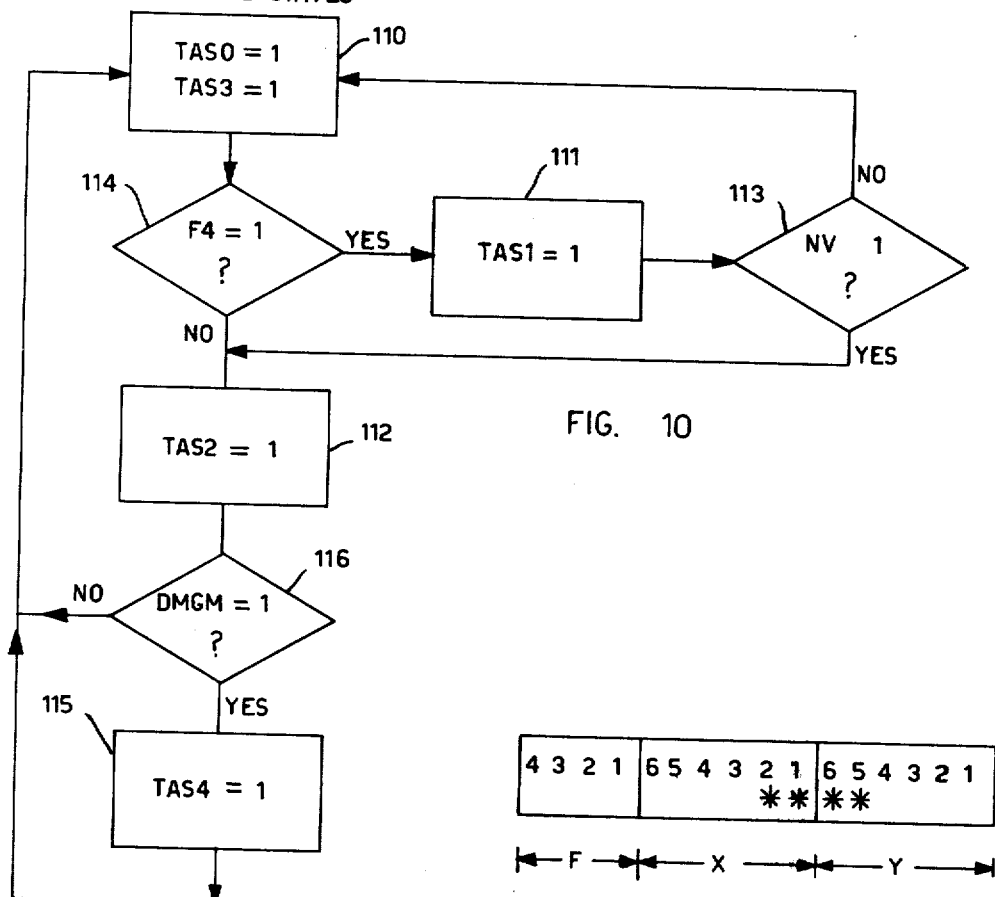
FIG. 10 is a flow chart of the machine states.

The machine timing is produced by a sequential logic network 22 (FIG. 3) included in the central unit 1, which causes the commands of the central unit 1 to have duration characteristics such as to stabilize various states or cycles of the machine. five different states may occur, these being called generally TAS in FIG. 3, and TAS0, TAS1 ... TAS4 in FIG. 10. To each of these there corresponds a homonymous flip-flop which remains set for the duration of a cycle time. The five flip-flops are in the sequence network 24 (FIG. 3) and make up a register TAS in which the present information is a function both of the preceding information and of the information of the ROM buffer 20.

Figure 9:
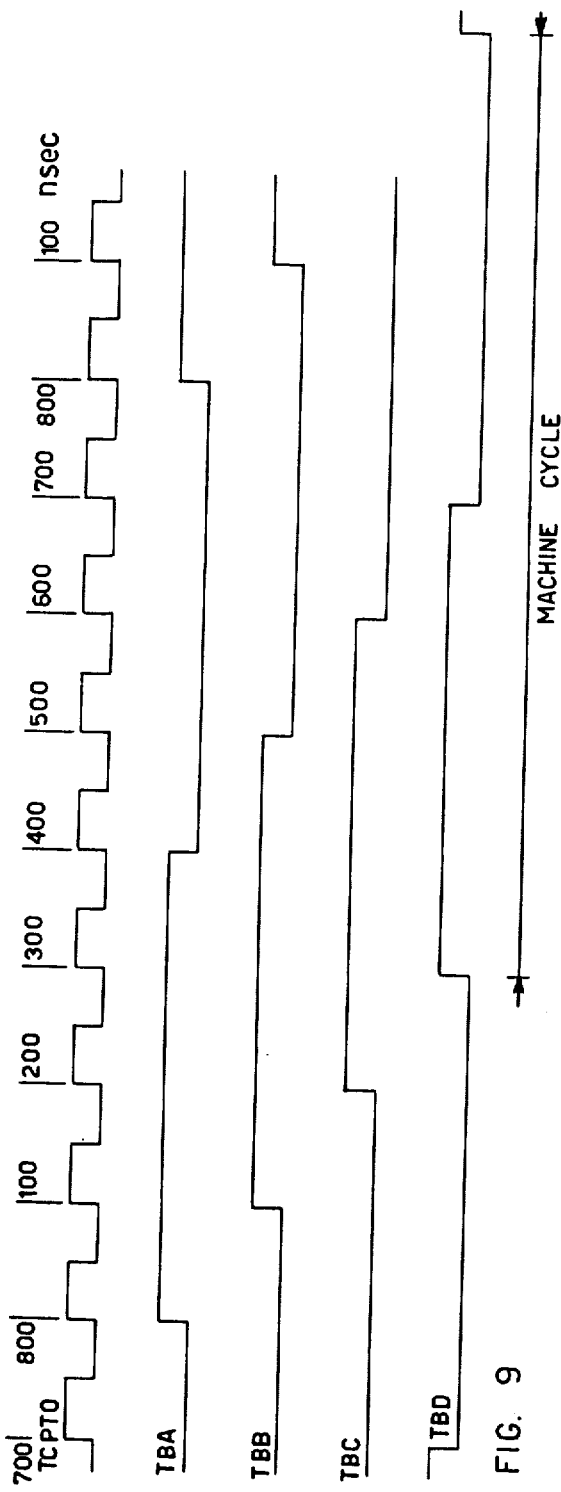
FIG. 9 is a timing diagram.

The timing logic network 22 comprises a quartz oscillator which generates a waveform TCPTO (FIG. 9) with a period of about 100 nanosecs. This is sent to a counter formed by four J-K connected flip-flops, so that there is obtained as output four waveforms TBA ... TBD with a period 8 times larger, that is of about 0.8 microsec. The various timing signals are indicated in FIG. 9. The period of the output signal TBD identifies the machine cycle.

To initiate a processing operation, the usual RESET key is pressed and puts the central unit 1 into a processing-commencement or start-awaiting state in a manner known per se. In normal operation, during the machine state defined by TAS0 and TAS3, simultaneously at 1 (stage 110 in FIG. 10), the microinstruction is read from the ROM buffer 20 and interpreted. During one or two states among the different states TAS1 - TAS2 - TAS2-TAS4, the microinstruction is executed; each microinstruction is therefore executed in a time which is a multiple of the machine cycle by means of a corresponding sequence of microoperations. The last microoperation carried out is, however, always the return to the states TAS0 - TAS3 of reading of the next microinstruction, the address of which is in the first register RO of the S.P. 16 (FIG. 3) updated by the central unit during the preceding reading stage.

A flip-flop NV of the sequence network 24 is connected to the AND circuit 131 and serves to exert an influence on the sequence of the register TAS, as will be seen better hereinafter.

Passage from one machine state to another takes place with the consent of the timing network. After the stage 110 of reading from the ROM 5 and of interpretation of the microinstruction, the machine passes to the state TAS1 (stage 111 in FIG. 10) if the bit of greater weight of the microinstruction code F4 is 1; otherwise, the machine passes to the state TAS2 (stage 112). In the first case, through the medium of the logical decision 113, the machine passes to the state TAS2 (phase 112) if NV is 1; otherwise, the machine goes on directly to read the next microinstruction (states TAS0 and TAS3 = 1, that is, stage 110).

In the event of the machine having passed from the logical decision 113 to the stage 112, a microinstruction must be carried out in two stages, such as, for example, a double addressing in the S.P. 16. On the other hand, the microinstructions interrogating the RAM 3 which have the bit of greater weight F4 = 0, while being carried out in two stages, come within the alternative case of direct passage to TAS2 after the reading through the medium of the decision 114, without passing through TAS1. These last microinstructions are concluded in the state TAS4 (stage 115). In practice, the addresses are handled in the state TAS2 and the data are handled in the state TAS4.

For all the remaining microinstructions which require a single addressing of the S.P. 16, the flow of states includes the state TAS2 occurring immediately after the reading of the microinstruction. These microinstructions are exhausted in the state TAS2, the command DMGM emitted by the network 24 and characteristic of the microinstructions interacting with the RAM3 not being present. In this case, there is a return from the logical decision 116 to the stage 110.

PRINCIPAL MICROINSTRUCTIONS FOR THE EXCHANGE OF DATA

Figure 5:
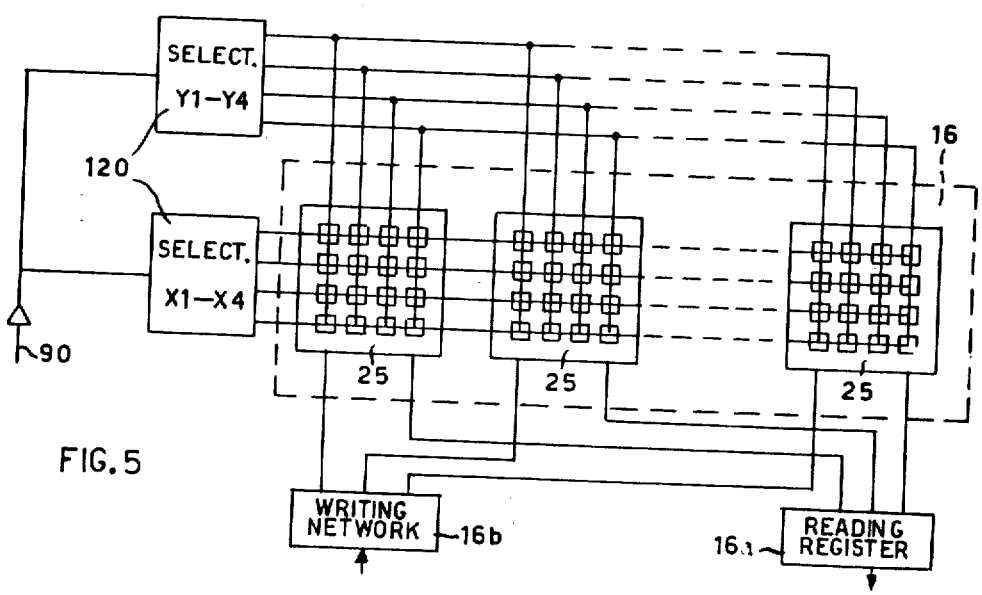
FIG. 5 is a complete diagram of the scratch pad memory of the computer.

The microinstruction IND serves to introduce an item of data from outside into the S.P. 16. In the state TAS2 following the interpretative stage 110 (FIG. 10), the field X of the microinstruction addresses the corresponding register of the S.P. 16 through a conductor 90 (FIGS. 3 and 5). In response to the microinstruction itself, the sequence network 24 generates a command for zeroizing the register and the following writing, emitted by the input item of data.

The microinstruction OUD serves to pass an item of data to the outside from the S.P. 16. In the state TAS2 following the interpretative stage, the field X of tch microinstruction addresses the register of the S.P. 16. The sequence network 24 generates a command for zeroizing the buffer 16a and a command for transfer of the item of data from the selected register to the buffer 16a, which emits it to the outside.

The microinstruction COM serves to send the commands of the microprogram to the outside. In the state TAS2 following the interpretative stage, the commands contained in the fields X and Y of the microinstruction are enabled by the sequence network 24 and issue at the interface 7 (FIG. 1).

The microinstruction SAE serves to perform a jump in the ROM 5 if a predetermined external condition appearing on the multiplexers 26 (FIG. 3) is verified. In the state TAS1 (stage 111 in FIG. 10) following the interpretative stage, the four bits X3 . . . X6 of the field X of the microinstruction arrive, in coincidence with a signal 132 (FIG. 3) emitted by the sequence network 24, at one of the two multiplexers 26 analyzing the external condition coming from the peripherals through the medium of the interface 7. In the event of the condition defined by the bits occurring, the OR of the outputs of the two multiplexers 26 generates a signal CCE which, in AND relationship with a signal BM0 emitted by the decoder 27 as decoded form of the microinstruction SAE, sets the flip-flop NV (FIG. 3), as a result of which passage to the state TAS2 (FIG. 10) takes place. This means, for the purposes of the change of state, that the external condition is present at a multiplexer 26 and, therefore, at a peripheral. In the state TAS2, the sequence network 24 causes the S.P. 16 to be addressed at the register RO, causes the register RO itself to be cleared and causes to be written therein the 8 bits of the field Y, X1, X2 of the microinstruction as the new address of the ROM 5, that is of the microinstruction to be executed after the jump. These eight bits are sufficient for addressing the ROM 5, since in this case the jump takes place within the limits of the half page of the ROM to which the microinstruction SAE in course of being processed belongs, comprising 256 microinstructions in all.

The microinstruction SAD serves to perform a jump in the ROM 5 if a predetermined one of the switching elements contained in the register R2 and the register SO2 of the S.P. 16 is set. In the state TAS1 following the interpretative stage, the contents of the registers R2 and SO2 are sent through the medium of the register 16a and a connection 30 to the 16 inputs of the multiplexers 126. At the multiplexers 126 there also arrive the four bits X3 . . . X6 of the field X of the same microinstruction which are enabled by a signal 133 emitted by the sequence network 24 for selecting one of the 16 switching elements. If the switching element selected is found high, the flip-flop NV in the sequence network 24 is set and produces passage to the state TAS2. The sequence network now addresses the S.P. 16 at the register RO, causes the zeroizing of the register RO of the S.P. 16 and produces the writing therein of the eight bits of the field Y, X1, X2, as the new address of the ROM 5, within the limits of the half page of the ROM to which the microinstruction SAD belongs.

The microinstruction SAN serves to perform a jump in the ROM 5 if a predetermined one of the 16 switching elements contained in the register R2 and the register SO2 of the S.P. 16 is not set. In the state TAS1 (FIG. 10) following the interpretative stage, the 16 bits of the aforesaid two registers are sent, through the medium of the register 16a and the connection 30 (FIG. 3), to the 16 inputs of the multiplexers 126 which are selected by four signals X3 . . . X6 from the field X of the same microinstruction SAN, in a similar manner to the preceding case. If the switching element selected is found low, there is output from the multiplexers 126 a signal CDE which, in AND relationship with the decoded form BM1 of the microinstruction SAN, sets the flip-flop NV in the sequence network 24. In the state TAS2, the register RO of the S.P. 16 is first addressed and then cleared. Then there are written therein the eight bits of the field Y – X1 – X2 of the microinstruction SAN, as the new address of the ROM 5, within the limits of the same half page.

The microinstruction INR writes to increment the register of the S.P. 16, addressed by the field X, by the quantity indicated by the field Y.

In the state TAS2 following the interpretative stage, the register of the S.P. 16 to be incremented is addressed by the field X of the microinstruction and sent to the adder 18a (FIG. 3) together with the contents of the field Y. The register in the S.P. 16 is zeroized by a zeroizing command, after which the result of the addition is retransferred to the address previously indicated by the field X. When a carry occurs, the switching element C is set.

The microinstruction ADI serves to add the 4-bit register of the S.P. 16 indicated by the field X to the operand contained in the field Y. The operations commanded by the microinstruction are identical to those described for the microinstruction INR.

The microinstruction ORI performs the logical OR function between the 4-bit register indicated by the field X and the contents of the field Y. If, in this field, a bit is put into a microprogramming state equal to 1, the corresponding bit of the S.P. register addressed by the field X will turn out to be equal to 1 even if it was at zero before. This register, modified in this way, is thereafter rewritten in the place previously occupied in the S.P.

The microinstruction ANI performs the logical AND function between the 4-bit register of the S.P. 16 addressed by the field X and the contents of the field Y. In the state TAS2 following the interpretative stage, the contents of the register selected by the field X are transferred to the logic network 118 (FIG. 3) together with the field Y. The output of the logic network 118 constitutes the input of the register selected by the field X, which in the meantime is zeroized by zeroizing commands of the sequence network 24.

INFORMATION INPUT KEYBOARD

Figure 6:
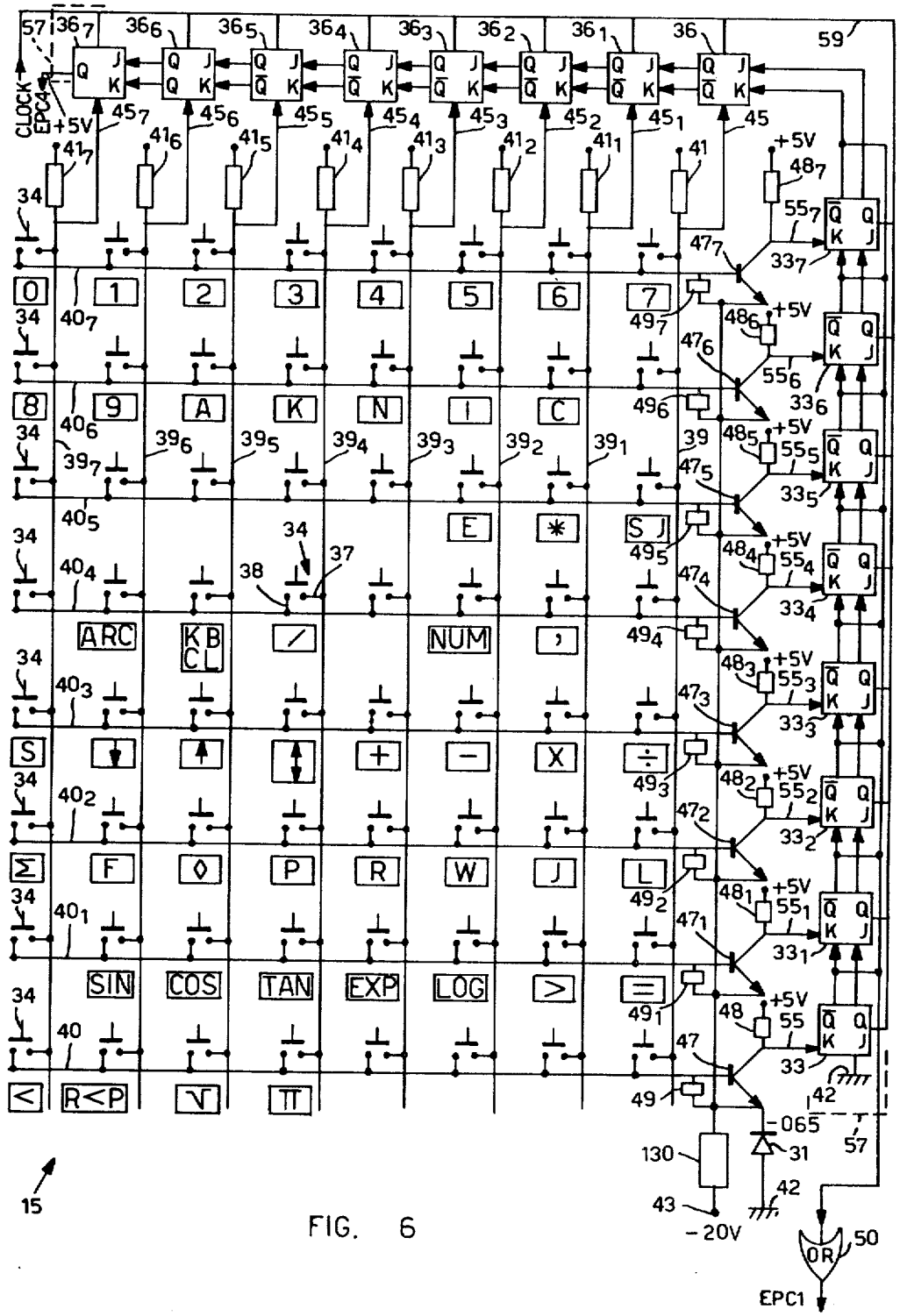
FIG. 6 is a diagram of the encoding circuits of the keyboard.

The keyboard 15 (FIG. 1) comprises a plurality of keys indicated diagrammatically by reference 34 (FIG. 6). In FIG. 6 there is indicated for each key the corresponding information which can be entered by it. The circuit of the various contacts represents a matrix constituted by eight rows and eight columns. In FIG. 6 the keys 34 are shown diagrammatically as being disposed in accordance with the said matrix, but in reality they may assume any arrangement by means of a suitable path of the conductors of the circuit. It will therefore be understood that the terms row and column are used herein merely as convenient labels for the coordinate directions of the matrix and do not imply any physical arrangement in rows and columns. Moreover it is convenient to assign the label "column" to the coordinate which is read out first.

In correspondence with each key 34 there are disposed two separate contact areas 37, 38 reachable by a movable snap contact known per se of the key 34 to produce the short-circuiting of these contact areas. (See the key in the fourth row down and fourth column from the left). Each of the areas 37, 38, for each row and column of keys, is connected to a corresponding column conductor 39, $39_1$, $39_2$ and so on, and to a corresponding row conductor 40, $40_1$, $40_2$ and so on, respectively, forming in this way a matrix of contacts 37, 38.

Each of the column conductors 39, $39_1$, $39_2$ . . . is individually connected through the medium of a resistor 41, $41_1$, $41_2$ to a source of constant voltage with a value of +2 5V, as a result of which the depression of a key 34, producing the short-circuiting of the areas 37, 38, produces a temporary electrical connection between a column conductor 39, $39_1$, $39_2$ . . . and a row conductor 40, $40_1$, $40_2$ . . . , at a corresponding intersection of the matrix. At this intersection there is generated an electric pulse used to define the coordinates of the intersection which identify the key actuated. To this end, each of the eight column conductors 39, $39_1$, $39_2$. . . is directly connected to the direct set terminal 45, $45_1$, $45_2$ . . . of a corresponding flip-flop 36, $36_1$, $36_2$ . . . of the J-K connected type, the operation of which will be seen hereinafter.

Each of the eight row conductors 40, $40_1$, $40_2$ . . . , on the other hand, is connected directly to the base of a corresponding transistor 47, $47_1$, $47_2$ . . . of the NPN type, the collector of which is supplied through a resistor 48, $48_1$, $48_2$ . . . by a common source of voltage with a value of +5V. The emitter of each of the transistors 47, $47_1$, $47_2$ . . . is connected to the corresponding base electrode through a resistor 49, $49_1$, $49_2$ . . . Moreover, the emitters are interconnected and are connected through a common resistor 130 to a point 43 at a negative potential of −20V and to the cathode of a diode 31, the anode of which is connected to a reference potential point 42.

Each collector of the eight transistors 47, $47_1$, $47_2$ . . . is independently connected to the direct set terminal 55 of a corresponding flip-flop 33, $33_1$, $33_2$ . . . which is also of the J-K type and like each of the flip-flops 36, $36_1$, $36_2$ . . . . The sixteen flip-flops 33, $33_1$, $33_2$ . . . , 36, $36_1$, $36_2$ . . . are moreover interconnected in series by connecting the input terminals J-K of each of the flip-flops $33_1$, $33_2$ . . . , 36, $36_1$, $36_2$ . . . $36_7$ respectively to the output terminals Q Q of the flip-flop 33, $33_1$, $33_2$ . . . , 36, $36_1$, $36_2$ . . . $36_6$ preceding it, producing in this way a single shift register 57, the flip-flops 33, $33_1$ . . . of which constitute a first section, while the flip-flops 36, $36_1$ . . . constitute a second section. The input terminal of this register 57 is the input terminal J of the flip-flop 33, which is connected to the reference potential point 42. The output terminal of the register 57, on the other hand, is represented by the direct output terminal Q of the flip-flop $36_7$. Clearly the transistors could be connected to the column conductors to control the group of flip-flops 36 to $36_7$ with the row conductors connected directly to the group of flip-flops 33 to $33_7$ and to +5V through resistors.

In addition to each of the flip-flops 36, $36_1$, $36_2$ . . . , 33, $33_1$, $33_2$ . . . having the terminals J-K and the direct set terminal 45, $45_1$, $45_2$ . . . , 55, $55_1$, $55_2$, . . . , it also has a clock terminal 59. Moreover, each of the negated output terminals $\overline{Q}$ of the flip-flops 33, $33_1$, $33_2$ . . . is connected to a corresponding input terminal of an OR circuit 50.

Each of the J-K flip-flops 33, $33_1$, . . . , 36, $36_1$, . . . can be set from Q = 0 to Q = 1, by a 1 level at its own input terminal J simultaneously with a clock pulse at the terminal 59. Moreover, the condition Q = 1 may be produced at any instant by driving the direct set terminal 55, $55_1$, $55_2$ . . . , 45, $45_1$, $45_2$ . . . with a logical 0 level. Conversely, in order to change over the level of the output Q from 0 to 1, a 1 level is necessary at the terminal K simultaneously with a clock pulse.

Before actuation of a key 34, the logical levels of the direct outputs Q of all of the flip-flops 33, $33_1$, $33_2$. . . , 36, $36_1$, $36_2$ . . . of the shift register are forcibly kept at 0 by the potential of the reference point 42 which drives the input terminal J of the first flip-flop 33. The clock pulses progagate the state Q = 0 to all the flip-flops. This situation cannot be changed until an external command inserts at least one 1 level in the flip-flop chain of the register 57.

By depressing a key 34, the short-circuiting of the contact areas 37, 38 of the corresponding intersection of the matrix is produced. The potential of +5V to which the corresponding column conductor 39, $39_1$, $39_2$ . . . is connected, through the resistor 41, $41_1$, $41_2$ . . . and the row conductor 40, $40_1$, $40_2$. . . , feeds the base of the transistor 47, $47_1$, $47_2$ . . . corresponding to the intersection energised. The transistor 47, $47_1$, $47_2$ changes over from the blocked state, produced by having the base and emitter at the same potential, to the saturated state. Consequently, the potential of the corresponding collector falls from the value of +5V to a potential close to that of the reference point 42. The result is, therefore, that the corresponding flip-flop 33, $33_1$, $33_2$ . . . being driven at the direct set terminal 55, $55_1$, $55_2$ . . . by a logical 0 level, changes over the level of its own direct output Q to a 1 level.

The short-circuiting of the contact areas 37, 38 moreover produces a 0 level at the direct set terminal 45, $45_1$, $45_2$ . . . of the corresponding flip-flop 36, $36_1$, $36_2$ . . . , since the direct set terminal drops from the 1 level at which it was maintained by the voltage of +5V through the resistors 41, $41_1$, $41_2$ . . . to a lower level established by the negative potential of the point 43.

In this way, the actuation of each key 34 produces the storage of a 1 level in two flip-flops, one belonging to the first groups of eight flip-flops, 33, $33_1$, $33_2$ . . . and the other belonging to the second group of eight flip-flops 36, $36_1$, $36_2$ . . . , that is, to each key 34 actuated there corresponds in the shift register 57 a pair of 1 bits stored in a corresponding pair of flip-flops.

In coincidence with each clock pulse, the information constituted by two stored bits is shifted along the 16 flip-flops by a succession of clock signals sent after a command emitted by the central unit, as will be seen better hereinafter. It is clear that for the transfer to the output of a bit of the information from the first to the last flip-flop of the shift register 57 16 clock pulses are necessary. The output of a bit from the register 57 constitutes a signal EPC4 which goes to the multiplexer 26 (FIG. 3) indicating the corresponding condition of the keyboard 15.

The encoding of the key 34 depressed is based on the count of the pulses which shift the set bits of the shift register 57 until the set bits issue therefrom.

An example will permit a better understanding. Let it be assumed that the key 34 depressed is P, which sets the flip-flops $33_2$ and $36_4$ in FIG. 6 and, therefore, sends the external condition EPC1 to the multiplexer 26 of the central unit 1 (FIG. 3) by the OR circuit 50 of the negated outputs $\overline{Q}$ of the first branch of the shift register 57. The bits X3 . . . X6 of the field X of the microinstruction SAE are sent through the buffer 20 to the selection inputs of the multiplexer 26 which collects the external condition signals EPC. The microinstruction SAE now causes the conditions of the keyboard 15 to be sensed. There is thus obtained from the multiplexer 26 a signal CCE which, in AND relationship with the decoded form BMO of the microinstruction SAE, generates the signal NV. This intervenes for the change of state in the sequence logic network 24, with the significance of "presence of external condition," and, therefore, in the following state TAS2 (FIG. 10) of execution of the microinstruction, permits the jump in the microprogram to a routine of microinstructions which is prearranged for the encoding of the data. This rountine is shown in the flow chart of FIG. 11.

Figure 11:
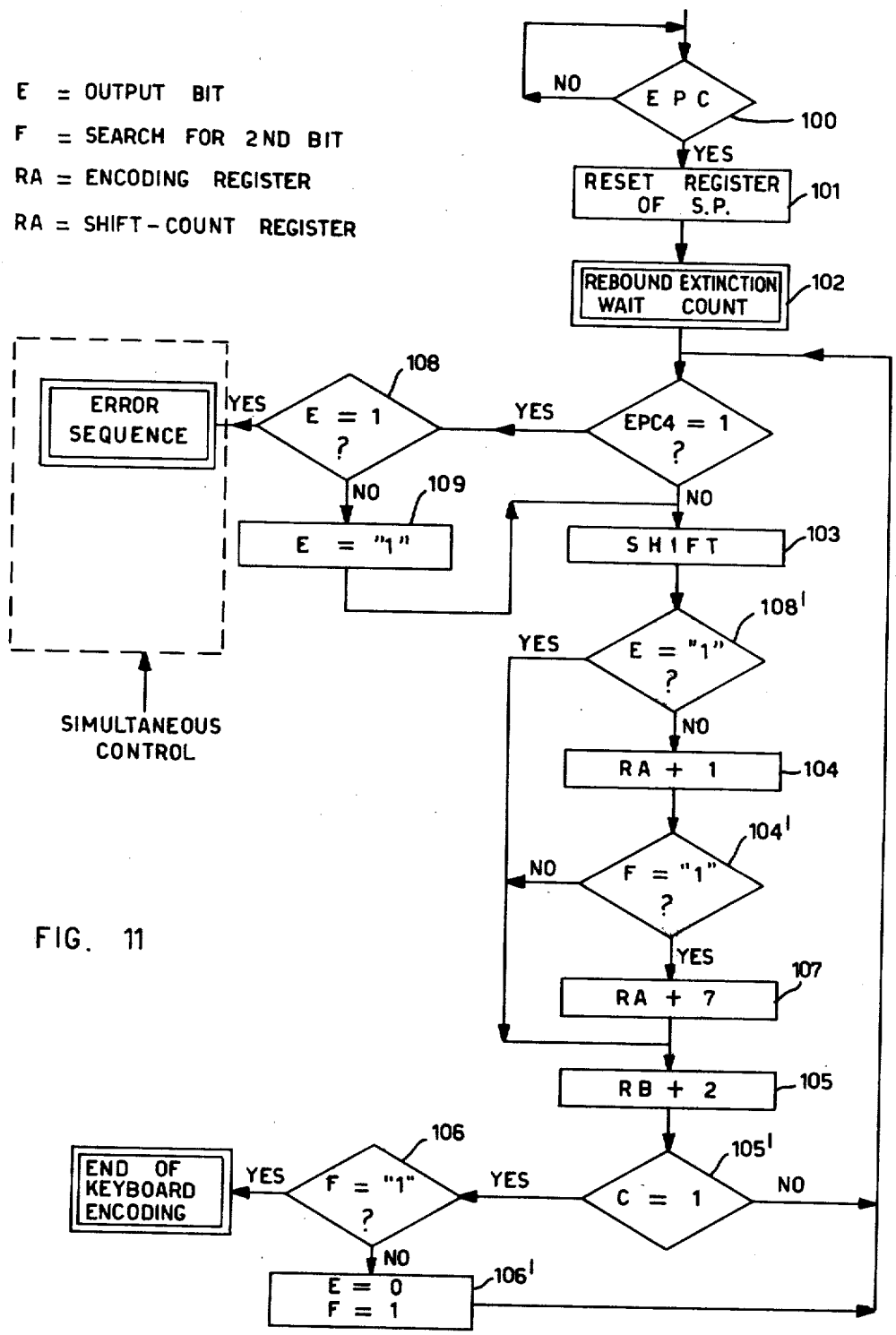
FIG. 11 is a flow chart of the keyboard encoding microprogramme.

The already mentioned "start awaiting" stage terminates when the signal EPC1 generated by the depression of a key 34 arrives at the multiplexer 26 (logical decision 100 in FIG. 11). Control of the central unit 1 then passes to a set of microinstructions ANI which, carrying out an AND operation between a 4-bit register of the S.P.s 16, indicated by the field X of the microinstruction, and the first four bits equal to zero contained in the field Y, produce the zeroizing of the registers of the S.P. 16 which are concerned by the data encoding routine (operation 101 in FIG. 11). Obviously, three successive microinstructions ANI are used for the 12-bit registers. The registers concerned by the data encoding routine are:

1. RA, which is used for effecting the encoding of the key 34 depressed, adding thereto the shift command pulses necessary for the extraction of the bit set in the section 36, $36_1$, . . . $36_7$ of the register 57 (FIG. 6);

2. RB, which is used for counting all eight shift command pulses necessary for bringing the bit set in the section 33, $33_1$ . . . $33_7$ of the register 57 from the original position to the corresponding position in the section 36, $36_1$ . . . $36_7$;

3. RC, which is used to avoid an encoding error due to rebound of the depressed key.

To avoid the encoding error, after a key has been depressed it is necessary to insure a wait of some milliseconds until rebound of the key has been extinguished (operation 102 in FIG. 11). In this way, the storage of another bit in the same flip-flop after the first shift command owing to the effect of a rebound is avoided. This wait is achieved by a set of microinstructions IMR which add to the register RC, addressed by the field X of the microinstruction, the constant contained in the field Y, in this case equal to 1. The addition +1 is repeated 4096 times, the number corresponding to the capacity of the register RC. As soon as this number is exceeded in the adder 18a (FIG. 3), the positioning of the switching element C of the register SO2 of the S.P. 16 at 1 is caused in known manner. This switching element C is then analyzed by a microinstruction SAD which acts after each microinstruction INR. As soon as the switching element C is found high, the series of additions is interrupted and control of the central unit 1 passes to the encoding routine true and proper.

At the beginning of the encoding routine, a microinstruction SAE commands the sampling of the input EPC4 of the multiplexer 26 to find out whether the bit in the section 36, $36_1$ . . . $36_7$ is present as output from the register 57. In our case, since the key P has been depressed, the bit was in the flip-flop $36_4$ at the beginning. So that this bit may issue from the register 57, it will be necessary in our case to carry out three shifts (operation 103 in FIG. 11), which are effected by a microinstruction COM which sends a clock pulse over the conductor 59 (FIG. 6) of the register 57.

It is to be noted that when EPC4 is present, that is when the bit issues from the register 57, the switching element E (FIG. 3) of the register SO2 of the S.P. 16 will have to be set. After each shift, a check is made whether this switching element has been set (logical decision 108' in FIG. 11). Until the bit set in the flip-flop $36_4$ appears as output, the register RA in the S.P. 16 is incremented by 1 at each shift (operation 104 in FIG. 11).

As will be seen hereinafter, a third switching element F (FIG. 3) of the register SO2 of the S.P. 16 is set after eight shifts and indicates the stage of search for the second bit set by the depressed key34 (FIG. 6). Until the switching element F is set, an addition microinstruction ADI commands the addition of 2 (contents of its field Y) to the register RB addressed by the field X of the same microinstruction (operation 105 in FIG. 11), for a reason which will be seen hereinafter.

As soon as the first bit appears as output, a microinstruction SAD commands sampling of the switching element E (logical decision 108) and, since this is not yet set, a microinstruction ORI attends to the setting thereof, performing an OR operation between the register SO2 of the S.P. 16 (FIG. 3), which is addressed by the field X of the microinstruction, and the first four bits of the field Y, which are equal, in this case, to 0010 (operation 109 in FIG. 11).

The register RA of the S.P. 16 now contains the result of this count, which in our case has a value of 3 and represents a part of the encoding of the depressed key. The number of shifts for extracting the first bit corresponds to the serial number of the column of the depressed key. Since the maximum number of these shifts is eight, this column is encoded in binary code with three bits. After this, the shift operations of the register 57 recommence (operation 103).

The logical decision 108' now gives a positive result, as a result of which the stage of incrementaition of the encoding register RA (operation 104) is skipped, while the register RB continues to increment itself up to the eighth shift (operation 105).

The switching element C of the register SO2 of the S.P. 16 is adapted to be set to indicate the overflow condition of register RB. This switching element C is tested, after each microinstruction ADI which effects the addition: RB + 2, by a microinstruction SAD. As long as the switching element C is found low, the routine resumes from the testing of the external condition EPC4, waiting for the bit to issue from the register 57. On the output of the first bit the register RB is not yet in overflow. Immediately after EPC4 is again zero, as a result of which the process continues until the register RB overflows. The value 16 having been reached in the adder 18a (FIG. 3) on the eighth shift, the adder itself produces the positioning of the switching element C in known manner. The following microinstruction SAD now finds the switching element C in the high position and produces the execution of another microinstruction SAD which now analyzes the switching element F (logical decision 106). Since this switching element has not yet been set, it is set by a microinstruction ORI (operation 106').

At the instant when the overflow of the register RB occurs, the second bit has shifted from the section 33, $33_1$ . . . $33_7$ into the corresponding position in the section 36, $36_1$ . . . $36_7$ of the register 57. After the switching element F has been set, a microinstruction ANI resets the switching element E (the same operation 106) and again permits the counting of the shift commands, this time to cause the second bit to issue from the first section of the shift register 57 into which it has shifted through the effect of the 8 clock pulses.

As has been seen, the column to which the keys 34 belong is identified by a progressive number running from left to right from 1 to 8. In each column the key 34 is identified by the serial number of the row which runs from top to bottom from 1 to 8. A key can be identified solely by the number which takes account of its row and column position counting the rows one after the other, including the zero both for the rows and for the columns. Therefore, the key "8" will have the serial number 9 and the key P in the 4th column and 6th row will have the serial number $5 \times 8 + 3 = 43$.

In extracting the 2nd bit from the register 57, it is necessary to preserve the position value originally possessed by it in the section $33, 33_1 \ldots 33_7$ of the register 57. The flip-flop $33_2$ may therefore represent the keys $\Sigma$, F to L represented by the numbers 40 to 47. The corresponding bit, now transferred to the flip-flop $36_2$, must therefore be counted with weight 8.

To this end, after setting the switching element F (logical decision 104'), each count RA + 1 is caused to be followed by an addition + 7 in binary (operation 107), so that the 3 bits of this second count are disposed side by side with the preceding three bits in the register RA of the S.P. 16, thus conferring the weight 8 on the three bits of the second count. In short, in the case of the key P we have, from the first count, the code 011 equal to 3 in decimal and, from the second count, the code 101 equal to 5 in decimal. The complete code obtained is: 101011 equal to 43.

Similarly to what has been described before, as soon as the second bit appears as output, the switching element E is now set (operation 109). This now causes the stages of addition RA + 1 to addition RA + 7 (operations 104 and 107) to be skipped. On the other hand, the incrementation of the register RB is continued until there is an overflow after eight shifts, thus ensuring the encoding of any key. This time, the testing of the switching element F caused by the second overflow of the register RB (operation 106 in FIG. 11) gives a positive result and starts an end-of-keyboard-encoding routine. This routine commands in known manner the transfer of the encoded data item in the register RA to a predetermined register of the S.P. 16. After this, a new encoding routine can begin in response to a possible new key being depressed.

It may happen that a second bit appears as output when the switching element E is still set. This means that two keys have been struck simultaneously. There is then executed a sequence of error signalling microinstructions. This sequence includes the lighting of a red error signalling lamp on the console and the clearing of the shift register 57 by a series of shift pulses of which the number is sufficient to extract even a bit possibly located in the last flip-flop of the shift register 57.

If the "Record program" key has not been depressed, the information encoded in the manner described and temporarily stored in the register of the S.P. 16 undergoes immediate processing by the central unit 1 as a function of the operative key depressed, the encoding of which is also in the S.P. 16. Alternatively, if the operator has preset the "Record program" pushbutton on the console 21 at ON, the information will be transferred to the store RAM3 through the reading buffer 16a under the control of a suitable series of microinstructions.

From what has been seen hereinafter, it is obvious that the keys 34 of the keyboard are arranged or ordered progressively and that the means ROM 5, 24, 57, 26 cause the placing in the memory S.P. 16 of a number corresponding to the progressive order of the key. More particularly, since the keys are arranged in a matrix of $m$ rows for $n$ columns, the counting means RA, 24, RB first effect the counting of the shift operations necessary so that the pulse recorded in the cell 36 ... $36_7$ of the first group may issue from the shift register and thereafter the counting of the shift operations necessary so that the pulse recorded in the cell 33 ... $33_7$ of the second group may issue from the said shift register. The encoding circuit of the keyboard is thus particularly simple, since it uses, in addition to the register 57, only structures present in the central unit of the computer.

What I claim is:

1. An input keyboard apparatus for an electronic computer comprising:
    a set of information input keys, each key operable for entering relevant information and wherein said keys are arranged in a predetermined progressive order;
    recording means actuatable upon operation of each key to generate at least one indicating signal corresponding to the operated key;
    a shift register conditionable by said recording means for recording said indicating signal in a position in the shift register corresponding to the position of the operated key;
    shift command means for repeatedly effecting said shift register to shift said indicating signal until the recorded indicating signal issues from the shift register; and
    counting means for counting the number shifts of said indicating signal effected by said shift command means in said shift register thereby producing relevant information in the form of a number corresponding to the progressive order of said operated key.

2. An apparatus according to claim 1, wherein the counting means comprises a binary register and wherein the representation of the counted number is in binary representing the encoding of the operated key.

3. An apparatus according to claim 2, further comprising a series of elements connected to the keys and arranged in a matrix of rows and columns, and wherein the shift register is divided into a first group of storage elements indicative of the columns and a second group of storage elements indicative of the rows of the matrix, and wherein said recording means includes means for recording an indicating signal in one of each group of storage elements each time a key is operated.

4. An apparatus according to claim 3, wherein the counting means comprises means cooperative with said binary register for first counting the number of shift operations necessary for the indicating signal recorded in the first group to issue from the shift register, and thereafter counting the number of shift operations necessary for the indicating signal recorded in the second group to issue from the shift register after the indicating signal has assumed a position in the first group corresponding to its initial position in the second group.

5. An apparatus according to claim 4, wherein the two groups of storage elements are disposed in series and wherein said counting means further comprises normally enabled means controlling the accumulation in said binary register, said controlling means disenabled on the output of the first indicating signal and a counter for re-enabling said controlling means when the second indicating signal is brought in the position of the first group of storage elements corresponding to the position of the second group initially occupied by the second indicating signal.

6. An apparatus according to claim 5, wherein the said counter has a capacity equal to an integral multiple of the number of rows of the matrix and is actuated to reach an overflow condition when the indicating signal of the second group arrives in the position corresponding to the position in the second group.

7. An apparatus according to claim 6, wherein said counting means further comprises an element settable by the overflow of said counter to produce the accumulation of the shift operations in the binary register with a weight equal to the maximum number of shift operations required for the extraction of the first indicating signal.

8. An apparatus according to claim 7, wherein the storage elements each comprise a J-K connected flip-flop.

9. An apparatus according to claim 8, wherein said recording means comprises a circuit for each key which closes in response to the operating of that key and sets a flip-flop indicating the column and a flip-flop indicating the row to which the key belongs, a transistor for each row or each column having its collector connected to a source of voltage and to the corresponding flip-flop of one of the groups of storage elements and having its base connected through the circuits of the keys in the corresponding row or column to the respective flip-flops in the other group of storage elements, thereby setting the two flip-flops corresponding to the key with the same reference potential.

10. An electronic computer comprising:
an information keyboard;
a memory for storing a code corresponding to an actuated key;
a control store which comprises a microprogram directing the elementary machine operation;
a central unit for executing the commands of the microprogram contained in the control store;
means for generating at least one pulse for each key actuation;
a shift register having a plurality of cells each corresponding to one of said keys and each receptive of the pulse generated in response to the corresponding key being actuated to store same therein;
means controlled by the central unit in response to an instruction of the microprogram for generating said code corresponding to the actuated key comprising means for shifting said shift register until the recorded pulse issues therefrom and means for carrying out a series of counting operations corresponding to the shifting of the shift register whereby the result of the series of counting operations corresponds uniquely to the key actuated on the keyboard.

11. Computer as in claim 10, wherein said pulse generating means generates a pair of pulses for each key actuation and wherein the two pulses are recorded in a pair of corresponding cells and wherein the said control store comprises an encoding microinstruction routine and recognition means for the microinstruction routine for first commanding the central unit to execute a series of additions for the counting of the shift commands necessary for the output of the first pulse from the said shift register, and then a second series of additions for the counting of the shift commands necessary for the output of the second pulse.

12. Computer as in claim 11, wherein said memory further comprises at least two switching elements settable during the encoding routine to define logical decisions.

13. Computer as in claim 12, further comprising a counter active in response to the activation of a key to count as far as overflow, means for initiating the execution of the encoding routine in response to the overflow of said counter, the capacity of said counter being such as to allow the extinction of the rebound of a contact actuated by the depressed key before overflow is reached.

14. Computer as in claim 12, wherein said central unit comprises means for setting a first one of the said switching elements under the control of the corresponding microinstruction to indicate the output of the first pulse and for setting a second switching element under the control of another microinstruction to indicate the overflow of the counting means, and means for resetting the first switching element in response to a third microinstruction when the said second switching element is set.

15. Computer as in claim 14, further comprising means for testing said first switching element to produce an error routine whenever more than one pulse issues from the said shift register before the overflow of the counting means, in order to prevent encoding in the event of simultaneous depression of more than two keys.

* * * * *